United States Patent
Son

(10) Patent No.: US 9,407,167 B2
(45) Date of Patent: Aug. 2, 2016

(54) TERMINAL CIRCUIT IN INVERTER

(71) Applicant: LSIS CO., LTD., Anyang-si, Gyeonggi-do (KR)

(72) Inventor: Jubeom Son, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/597,068

(22) Filed: Jan. 14, 2015

(65) Prior Publication Data

US 2015/0207430 A1 Jul. 23, 2015

(30) Foreign Application Priority Data

Jan. 20, 2014 (KR) .................. 10-2014-0006669

(51) Int. Cl.
*H02M 7/537* (2006.01)
*H03K 17/795* (2006.01)
*H03K 19/0175* (2006.01)
*H04B 10/80* (2013.01)

(52) U.S. Cl.
CPC ............. *H02M 7/537* (2013.01); *H03K 17/795* (2013.01); *H03K 19/0175* (2013.01); *H04B 10/802* (2013.01)

(58) Field of Classification Search
CPC . H01J 3/021; H01L 29/155; H01L 29/66318; H01L 29/66462; H01L 29/802; H03K 17/79; H03K 3/42; H03K 17/795; H03K 19/0175; H03M 1/667; H03M 1/74; H03M 1/808; H04B 10/802
USPC ................................ 326/83; 250/551; 363/131
See application file for complete search history.

(56) References Cited

U.S. PATENT DOCUMENTS

| | | | |
|---|---|---|---|
| 4,321,487 A | 3/1982 | Huykman | |
| 2005/0069326 A1 | 3/2005 | Onde et al. | |
| 2011/0114858 A1* | 5/2011 | Oono | G05B 19/054 |
| | | | 250/551 |
| 2014/0355724 A1* | 12/2014 | Hayakawa et al. | 375/342 |

FOREIGN PATENT DOCUMENTS

| | | | |
|---|---|---|---|
| JP | 2013112905 | * | 5/2013 |
| KR | 10-2011-0055450 | | 5/2011 |
| KR | 10-1186701 | | 9/2012 |
| WO | 2012/117472 | | 9/2012 |

OTHER PUBLICATIONS

Korean Intellectual Property Office Application Serial No. 10-2014-0006669, Office Action dated Aug. 13, 2015, 5 pages.
European Patent Office Application Serial No. 15151211.8, Search Report dated Apr. 24, 2015, 6 pages.

* cited by examiner

*Primary Examiner* — Alexander H Taningco
*Assistant Examiner* — Seokjin Kim
(74) *Attorney, Agent, or Firm* — Lee, Hong, Degerman, Kang & Waimey; Jonathan Kang; Richard Salfelder

(57) ABSTRACT

A terminal circuit in an inverter is disclosed, the terminal circuit including a photo-coupler configured to electrically insulate input/output signals, to receive, as input, an open collector output signal or a pulse output signal from a first port and to output the open collector output signal or the pulse output signal to a second port through a first output terminal, a transistor in which a base (B) terminal is connected to a second output terminal of the photo-coupler. And a bias resistor connected to a base (B) terminal of the transistor and to an emitter (E) terminal.

2 Claims, 4 Drawing Sheets

TERMINAL CIRCUIT IN INVERTER

CROSS-REFERENCE TO RELATED APPLICATIONS

Pursuant to 35 U.S.C.§119 (a), this application claims the benefit of earlier filing date and right of priority to Korean Patent Application No. 10-2014-0006669, filed on Jan. 20, 2014, the contents of which are hereby incorporated by reference in their entirety.

BACKGROUND OF THE DISCLOSURE

1. Field

The teachings in accordance with the exemplary embodiments of this present disclosure generally relate to a terminal circuit in an inverter.

2. Background

In general, an electric output of an inverter is outputted through various terminals and hardware realized with a terminal circuit is commonly called a terminal block. FIGS. 1*a* and 1*b* are circuit diagrams illustrating terminals used for an inverter according to prior art, where FIG. 1*a* is a circuit diagram of a terminal relative to an output of open collector and FIG. 1*b* is a circuit diagram of a terminal relative to a pulse output.

It can be noted that an output signal of the open collector in FIG. 1*a* is inputted to a port A to be outputted to a port B through a photo coupler and a transistor, and a pulse output signal in FIG. 1*b* is inputted to a port C to be outputted to a port D through a transistor. As noted above, an open collector output and a pulse output in an inverter are respectively independent in function thereof, where each terminal is formed separately to be outputted to a separate terminal block to disadvantageously restrict miniaturization of size of input/output unit of inverter, to increase the number of terminal blocks and to thereby increase the inverter costs.

SUMMARY OF THE DISCLOSURE

The present disclosure is to provide a terminal circuit in an inverter configured to process both an open collector output and a pulse output through one single terminal block, thereby reducing the number of terminal blocks and the costs.

In one general aspect of the present disclosure, there is provided a terminal circuit in an inverter, the terminal circuit comprising:
a photo-coupler configured to electrically insulate input/output signals, to receive, as input, an open collector output signal or a pulse output signal from a first port and to output the open collector output signal or the pulse output signal to a second port through a first output terminal;
a transistor in which a base (B) terminal is connected to a second output terminal of the photo-coupler; and a bias resistor connected to a base (B) terminal of the transistor and to an emitter (E) terminal, wherein a resistance value of the bias resistor may be so determined as to allow a duty ratio of the pulse output signal to be within a predetermined scope.

Preferably, but not necessarily, any one of the open collector output signal and the pulse output signal may be received through the first port by an inverter parameter inputted from a user input unit.

Preferably, but not necessarily, the terminal circuit may further comprise a pull-up resistor connected between the first output terminal of the photo-coupler and the second port.

Advantageous Effects of the Disclosure

The exemplary embodiments of this present disclosure has an advantageous effect in that size of inverter terminals can be reduced and a duty compensation design can be provided at the time of pulse output by using a single terminal configured to perform a dual (two-way) function of an open collector output function and a pulse output function. Another advantageous effect is that an open collector output function and a pulse output function can be selectively chosen by parameter setting to allow free conversion between these two functions.

DETAILED DESCRIPTION OF THE DISCLOSURE

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, the described aspect is intended to embrace all such alterations, modifications, and variations that fall within the scope and novel idea of the present disclosure.

Hereinafter, exemplary embodiments of the present disclosure will be described in detail with reference to the accompanying drawings.

Figure 2:
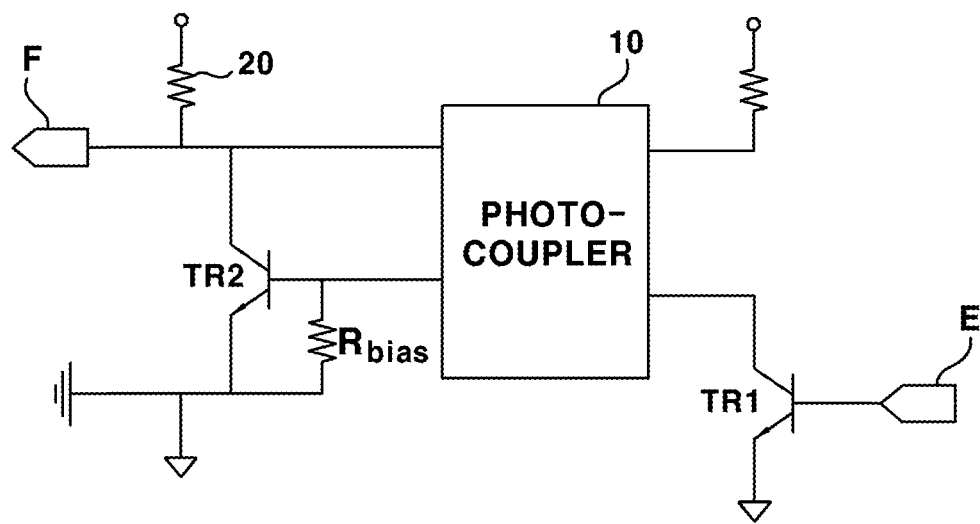
FIG. 2 is an inverter terminal circuit diagram according to an exemplary embodiment of the present disclosure.

FIG. 2 is an inverter terminal circuit diagram according to an exemplary embodiment of the present disclosure.

Referring to FIG. 2, a terminal circuit according to the present disclosure is configured in such a manner that an open collector output signal or a pulse output signal may be inputted through a port E, and an open collector output signal or a pulse output signal may be outputted to a port F through a photo-coupler (10).

Figure 1A:
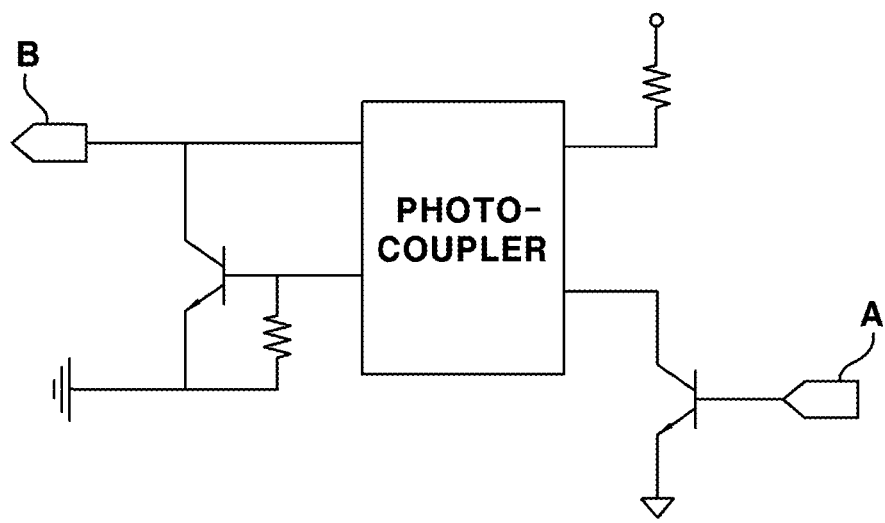
FIGS. 1*a* and 1*b* are circuit diagrams illustrating terminals used for an inverter according to prior art.
Figure 1B:
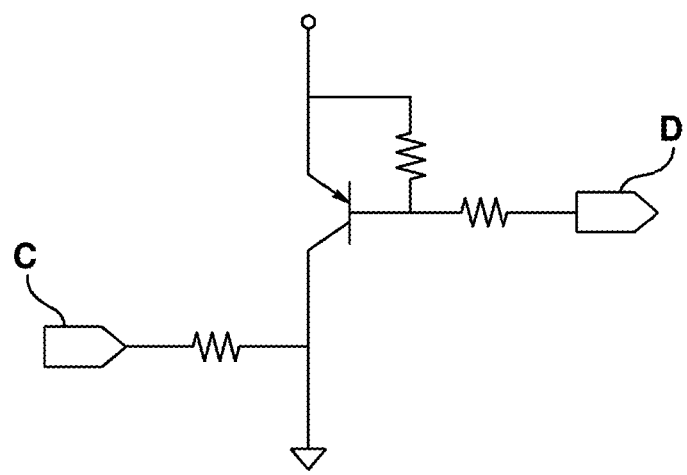

Thus, the port F may be connected to a device using an open collector output signal as input and to a device using a pulse output signal as input, the configuration of which may be explained by FIGS. 1*a* and 1*b* in which a port B for an open collector output terminal and a port D for a pulse output terminal are combined or integrated to allow two outputs to be outputted from the port B.

That is, a port E is an input port and a port F is an output port in the terminal circuit according to the present disclosure. Thus, a pulse output signal or an open collector output signal inputted to the port E through a transistor (TR1) may be outputted to the port F through a photo-coupler (10), a bias resistor (Rbias), a transistor (TR2). The bias resistor (Rbias) may be connected to a base (B) and an emitter terminal (E) of the transistor (TR2).

The photo-coupler (10) may be used to electrically insulate an input signal and an output signal. A first output terminal of the photo-coupler (10) may be connected to a port F, and a second output may be connected to a base terminal of the transistor (TR2).

A user can check an inverter parameter through a user input unit (e.g., HMI (Human-Machine Interface) connected to an inverter, whereby it can be checked whether a relevant terminal is used as an open collector output terminal, or as a pulse output terminal.

A pull-up resistor (20) connected to a collector (C) of output port F (or transistor TR2) may be determined of its use by a device using a pulse output signal as input. If the device using the pulse output signal as input receives an open collector-type pulse input, no wiring is required for pull-up resistor (20). For example, there are many pulse metering devices capable of receiving an open collector-type pulse input. A pull-up resistor (20) may be connected when a device not receiving an open collector-type pulse input is connected for pulse input.

A resistance value of the pull-up resistor (20) may be determined in consideration of time constant. The time constant is an index indicating how fast or slow a certain circuit reacts to an input from outside, and therefore may vary depending on characteristic of a circuit. Thus, the resistance of the pull-up resistor (20) may be determined in consideration of a time constant of a circuit.

When a pulse is outputted through a terminal circuit of the present disclosure, selection of a time constant configured to guarantee a pulse output is required, because a circuit using an open collector output as pulse output. That is, the terminal circuit according to the present disclosure generates a rising time and a falling time of pulse output signal according to a time constant at the time of pulse output, and the rising time and the falling time have an influence on a duty of the pulse output signal.

Figure 3A:
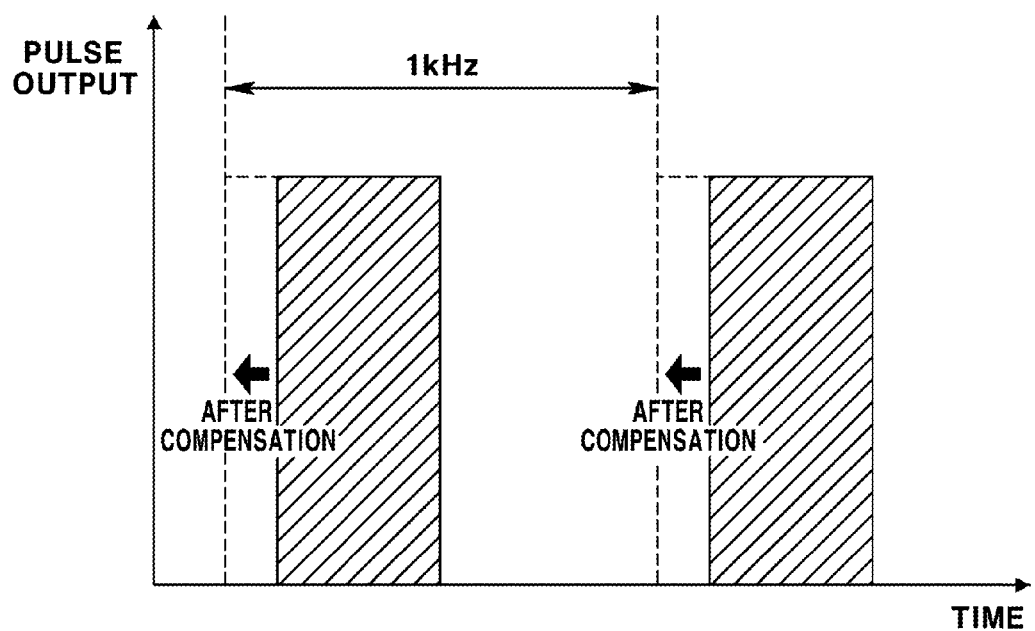
FIGS. 3*a* and 3*b* are exemplary views illustrating an actual pulse and a pulse by compensation at the time of pulse output according to an exemplary embodiment of the present disclosure.
Figure 3B:
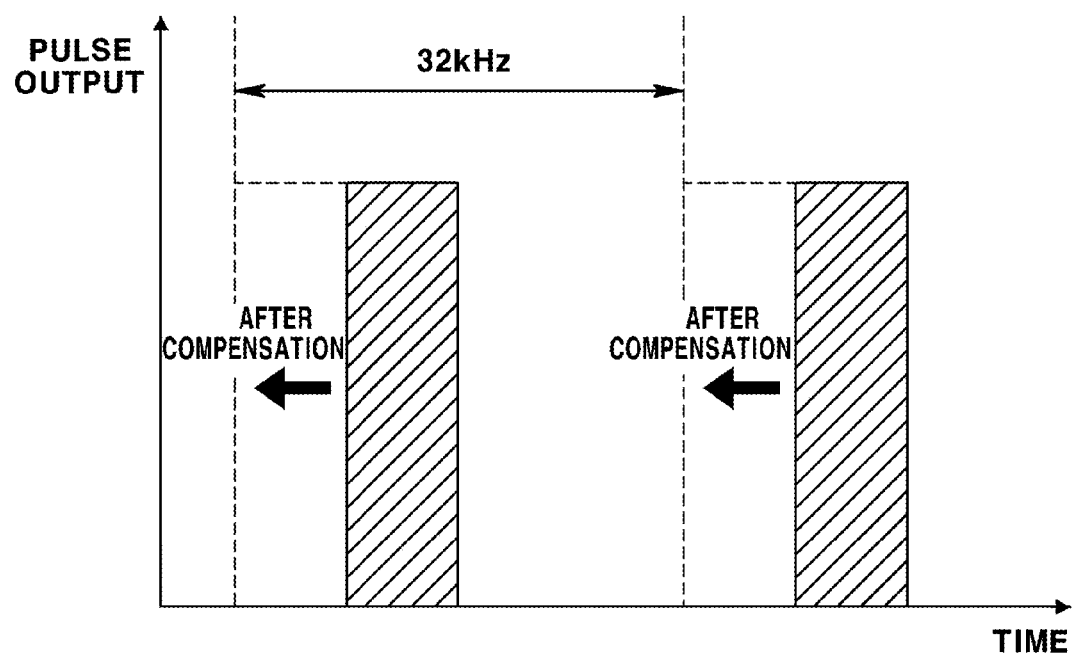

FIGS. 3a and 3b are exemplary views illustrating an actual pulse and a pulse by compensation at the time of pulse output according to an exemplary embodiment of the present disclosure, where FIG. 3a illustrates a case when a pulse is outputted at a frequency of 1 kHz, and FIG. 3b illustrates a case when a pulse is outputted at a frequency of 32 kHz.

Referring first to FIG. 3a, when a pulse is outputted at a frequency of 1 kHz with 50% duty ratio, it can be noted that the duty ratio decreases below 50% in response to a rising time and a falling time. In the present disclosure, a value of bias resistor (Rbias) of the photo-coupler (10) may be determined for selection of a time constant guaranteeing a pulse output.

Now, referring to FIG. 3b, when a pulse is outputted at a frequency of 32 kHz with 50% duty ratio, it can be noted that the duty ratio of pulse further decreases over that of FIG. 3a due to fast frequency. In the present disclosure, a value of bias resistor (Rbias) of the photo-coupler (10) can be adequately designed for guaranteeing a duty ratio of pulse within a predetermined scope.

In the present disclosure, whether to output a pulse output signal or an open collector output signal may be possible by setting of inverter parameter. A user may set an inverter parameter through a user input (e.g., HMI) to output an open collector output signal or only a pulse output signal.

Although the present disclosure has been described in detail with reference to the foregoing embodiments and advantages, many alternatives, modifications, and variations will be apparent to those skilled in the art within the metes and bounds of the claims. Therefore, it should be understood that the above-described embodiments are not limited by any of the details of the foregoing description, unless otherwise specified, but rather should be construed broadly within the scope as defined in the appended claims.

What is claimed is:

1. A terminal circuit in an inverter, the terminal circuit comprising:
    a photo-coupler configured to electrically insulate input/output signals, receive an open collector output signal or a pulse output signal from a first port and to output the received open collector output signal or pulse output signal to a second port via a first output terminal;
    a pull-up resistor variably connected between the first output terminal and the second port, a resistance value of the pull-up resistor determined by a time constant;
    a transistor having a base (B) terminal connected to a second output terminal of the photo-coupler; and
    a bias resistor connected to the B terminal of the transistor and to an emitter (E) terminal of the transistor, a resistance value of the bias resistor determined such that a duty ratio of the pulse output signal is within a predetermined range,
    wherein connection of the pull-up resistor is determined by a device using the pulse output signal as an input such that the pull-up resistor is not connected when the device receives an open collector-type pulse input and the pull-up resistor is connected when the device does not receive the open collector-type pulse input.

2. The terminal circuit of claim 1, wherein the open collector output signal or pulse output signal is received from the first port by an inverter parameter input from a user input unit.

* * * * *